United States Patent
Chen

(10) Patent No.: US 8,405,983 B2
(45) Date of Patent: Mar. 26, 2013

(54) RACKABLE SERVER SYSTEM

(75) Inventor: Xiao-Zhu Chen, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

(*) Notice: Subject to any disclaimer, the term of this patent is extended or adjusted under 35 U.S.C. 154(b) by 207 days.

(21) Appl. No.: 13/087,333

(22) Filed: Apr. 14, 2011

(65) Prior Publication Data

US 2012/0170208 A1 Jul. 5, 2012

(30) Foreign Application Priority Data

Dec. 31, 2010 (CN) .......................... 2010 1 0618205

(51) Int. Cl.
*H05K 7/20* (2006.01)

(52) U.S. Cl. .............. 361/690; 361/679.47; 361/679.48; 361/679.5; 361/695; 361/696; 165/104.33; 165/121; 165/122; 165/185; 454/184

(58) Field of Classification Search .................. 361/679.46–679.53, 690–696, 361/717–727; 165/104.33, 104.34, 80.3, 165/80.4, 80.5, 121–126, 185; 415/146, 415/148, 182, 26, 211; 454/184; 312/223.2, 312/223.3, 236; 137/512, 527.8; 174/50, 174/17 VA, 135
See application file for complete search history.

(56) References Cited

U.S. PATENT DOCUMENTS

| | | | | |
|---|---|---|---|---|
| 3,184,275 A * | 5/1965 | Gardner | ...................... | 312/213 |
| 6,052,281 A * | 4/2000 | Hardt et al. | .................... | 361/690 |
| 6,181,557 B1 * | 1/2001 | Gatti | ............................. | 361/695 |
| 6,542,363 B2 * | 4/2003 | White | .......................... | 361/695 |
| 6,710,240 B1 * | 3/2004 | Chen et al. | ................. | 174/17 VA |
| 6,771,499 B2 * | 8/2004 | Crippen et al. | .......... | 361/679.48 |
| 6,991,533 B2 * | 1/2006 | Tsai et al. | ...................... | 454/184 |
| 7,416,481 B2 * | 8/2008 | Baker et al. | ................... | 454/184 |
| 7,432,441 B2 * | 10/2008 | Liang | ............................. | 174/50 |
| 7,646,601 B2 * | 1/2010 | Zhang et al. | .................. | 361/695 |
| 7,800,902 B2 * | 9/2010 | Della Fiora et al. | ......... | 361/695 |
| 7,830,659 B2 * | 11/2010 | Liu et al. | ....................... | 361/690 |
| 7,843,683 B2 * | 11/2010 | Suffern et al. | ........... | 361/679.46 |
| 8,035,970 B2 * | 10/2011 | Schott | ........................... | 361/695 |
| 8,142,140 B2 * | 3/2012 | Warizaya | ...................... | 415/146 |
| 8,199,486 B2 * | 6/2012 | Chen et al. | ............... | 361/679.51 |
| 8,270,155 B2 * | 9/2012 | Tipley | ...................... | 361/679.47 |
| 2009/0154114 A1 * | 6/2009 | Peng et al. | ..................... | 361/728 |
| 2010/0073868 A1 * | 3/2010 | Mayer et al. | ............. | 361/679.51 |
| 2011/0053485 A1 * | 3/2011 | Huang et al. | .................. | 454/184 |

FOREIGN PATENT DOCUMENTS

| GB | 2295669 A | * | 6/1998 |
|---|---|---|---|
| GB | 2354316 A | * | 8/2001 |
| JP | 2002176281 A | * | 6/2001 |

* cited by examiner

*Primary Examiner* — Michail V Datskovskiy
(74) *Attorney, Agent, or Firm* — Altis Law Group, Inc.

(57) ABSTRACT

A rackable server system includes a rack, a fan assembly mounted to a rear of the rack, and a number of server units slidably mounted in the rack. The fan assembly includes a frame defining a number of air passages, a number of door plates mounted to the frame and correspondingly arranged in the passages, and a number of fans fixed to a rear of the frame. The air passages are correspondingly aligned with the fans. The server units are correspondingly aligned with the air passages and resist against the door plates to pivot the door plates, thereby uncovering the air passages.

16 Claims, 6 Drawing Sheets

RACKABLE SERVER SYSTEM

BACKGROUND

1. Technical Field

The present disclosure relates to a rackable server system.

2. Description of Related Art

A rackable server system includes a rack, and a plurality of server units slidably mounted to the rack. Each of the server units is equipped with one or more fans to exhaust the heat out of the server unit. Therefore, the rackable server system requires a great quantity of fans, which are expensive and occupy a great deal of space inside the server units.

BRIEF DESCRIPTION OF THE DRAWINGS

Many aspects of the present embodiments can be better understood with reference to the following drawing. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION OF THE DESCRIPTION

Figure 1:
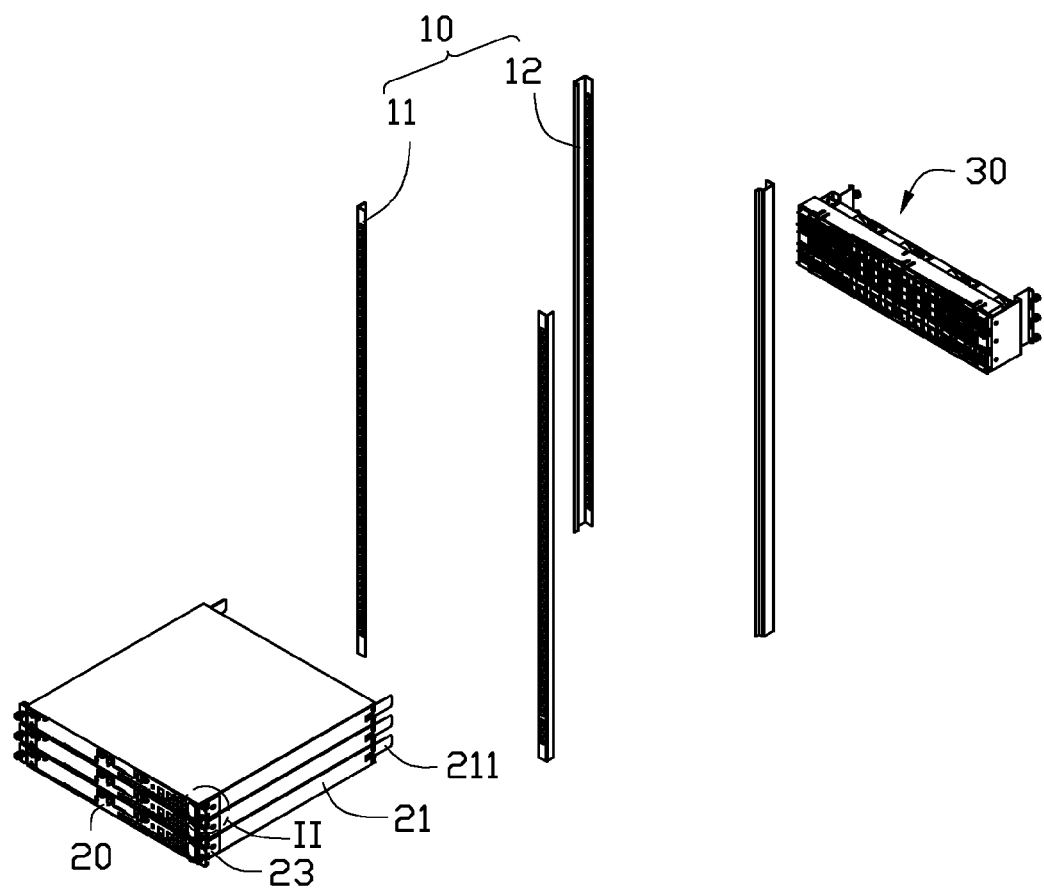
FIG. 1 is an exploded, isometric view of an embodiment of a rackable server system, which includes a rack, three server units, and a fan assembly.

Referring to FIG. 1, an embodiment of a rackable server system includes a rack 10, three server units 20, and a fan assembly 30.

The rack 10 includes two front support post 11, and two rear support post 12. Each of the front support posts 11 and the rear support posts 12 longitudinally defines a plurality of threaded positioning holes (not labeled).

Figure 2:
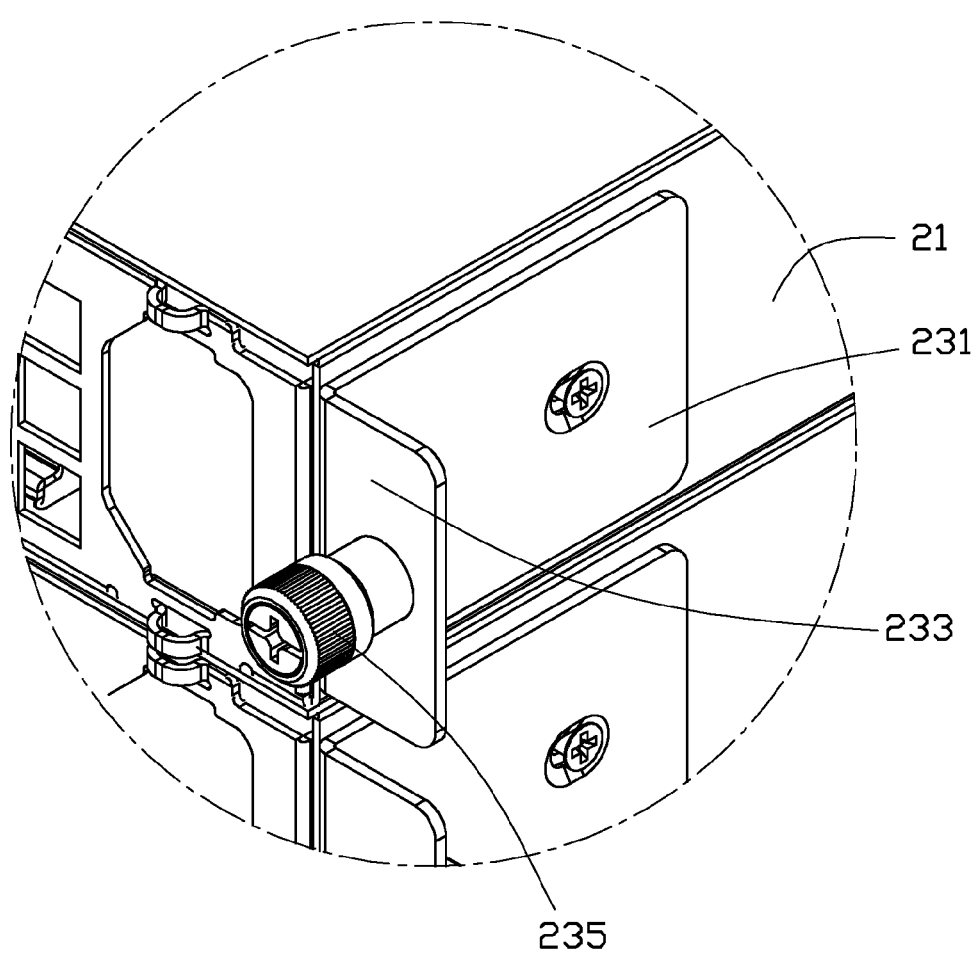
FIG. 2 is an enlarged view of an encircled portion II of FIG. 1.

Referring to FIGS. 1 and 2, each of the server units 20 includes a chassis 21 receiving a plurality of electronic components (not shown) therein, and two mounting brackets 23 respectively mounted to opposite sides of the chassis 21. Two tabs 211 respectively extend from rear ends of the opposite sides of the chassis 21. Each of the mounting brackets 23 includes a first plate 231 fixed to the chassis 21, a second plate 233 perpendicularly extending from the first plate 231 away from the chassis 21, and a captive screw 235 attached to the second plate 233.

Figure 3:
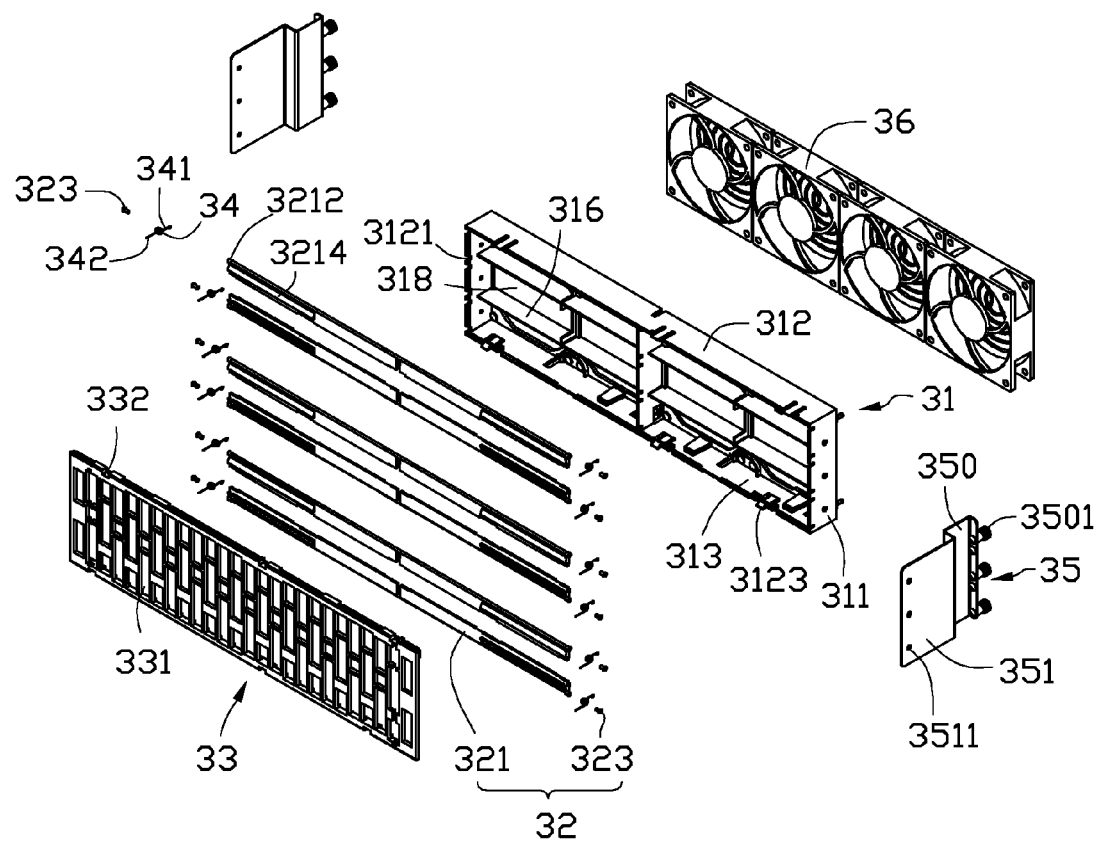
FIGS. 3 and 4 are exploded, isometric views of the fan assembly of FIG. 1, but viewed from different perspectives.
Figure 4:
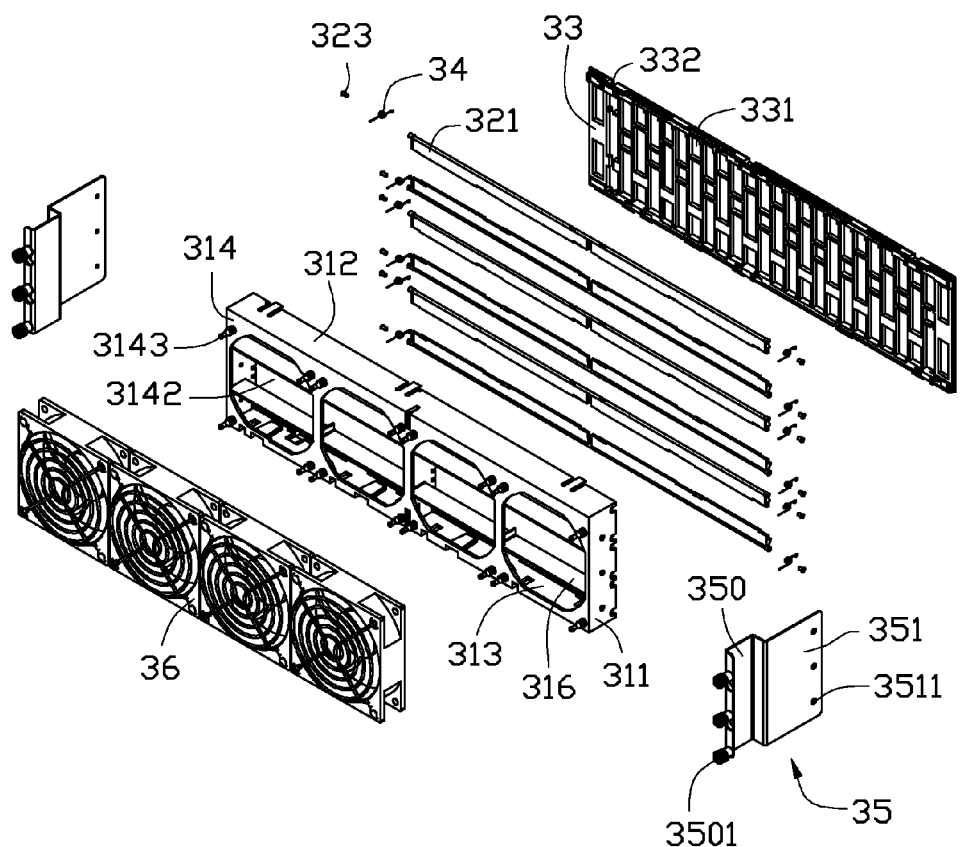

Referring to FIGS. 3 and 4, the fan assembly 30 includes a frame 31, six door members 32, a vent plate 33, a plurality of resilient members 34, two support members 35, and a plurality of fans 36.

The frame 31 is substantially rectangular, and includes a top wall 312, a bottom wall 313 parallel to the top wall 312, two parallel sidewalls 311 connected between corresponding ends of the top wall 312 and the bottom wall 313. In addition, a back plate 314 connects to the rear sides of the sidewalls 311, the top wall 312, and the bottom wall 313. Two spaced partitioning plates 316 are arranged in the frame 31, perpendicularly connected between the opposite sidewalls 311. The partitioning plates 316, the sidewalls 311, the top wall 312, and the bottom wall 313, respectively bound three air passages 318. Each of the sidewalls 311 defines six pivot slots 3121, in front sides of the sidewalls 311. Two adjacent pivot slots 3121 of each sidewall 311 correspond to an air passage 318. Three engaging portions 3123 extend forward from a front side of each of the top wall 312 and the bottom wall 313. The back plate 314 longitudinally defines four spaced openings 3142. A plurality of positioning pins 3143 extends from the back plate 314, around each opening 3142.

Each of the door members 32 includes a door plate 321 and two retaining members 323. Two shafts 3212 extend from opposite ends of a side of each door plate 321, adjacent to a side of the door plate 321. Two abutting blocks 3214 protrude from opposite ends of a front surface of each of the door plates 321. Each of the shafts 3212 axially define an axis hole (not shown). Each of the retaining members 323 includes a head portion and a shank extending from a side of the head portion.

Three securing holes 332 are defined in both the top and bottom sides of the venting plate 33.

In one embodiment, the resilient members 34 are torque springs, each including a first torque arm 341 and a second torque arm 342.

Each of the support members 35 includes a substantially U-shaped holding portion 350, and a connecting plate 351 extending forward from a front side of the holding portion 350. A plurality of captive screws 3501 is mounted to a rear side of the holding portion 350 opposite to the connecting plate 351. A plurality of fixing holes 3511 is defined in the connecting plate 351, adjacent to a front end of the connecting plate 351 away from the holding portion 350.

Figure 5:
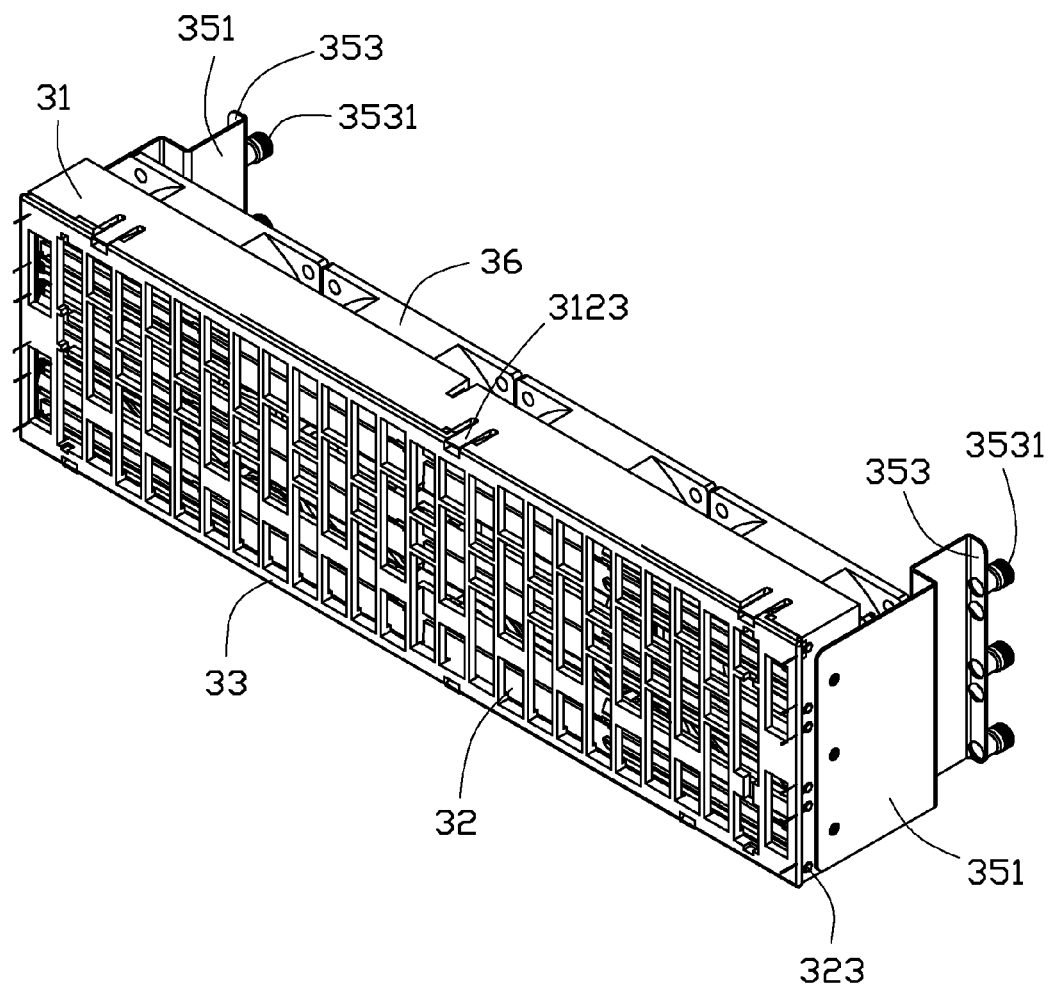
FIG. 5 is an assembled view of FIG. 3.

Referring to FIG. 5, in assembly of the fan assembly 30, two resilient members 34 are respectively placed around the shafts 3212 of the door plate 321 of each door member 32. The door member 32 is attached to the frame 31, with the shafts 3212 of the door plate 321 pivotably engaged in two of the pivot slots 3121 of the frame 31, which are respectively arranged in the two sidewalls 311, and aligned with each other. The abutting block 3214 of the door plate 321 faces forward. The first torque arms 341 of the resilient members 34 resist against a back of the door plate 321. The two retaining members 323 of the door member 32 are mounted to the shafts 3212, with the shanks of the retaining members 323 engaging in the axis holes of the shafts 3212. Moreover, the head portions of the retaining members 323 abut against outer surfaces of the sidewalls 311 of the frame 31 to prevent the door member 32 from disengaging from the frame 31. Therefore, two door members 32 are arranged in each of the air passages 318 of the frame 31, to cooperatively cover or uncover the air passage 318. The vent plate 33 is mounted to the frame 31 opposite to the back plate 314, with the engaging portions 3123 of the frame 31 correspondingly engaged in the securing holes 332 of the vent plate 33. The second torque arms 342 of the resilient member 34 resist against the vent plate 33. The fans 36 are mounted to the back plate 314 of the frame 31, and are correspondingly aligned with the openings 3142, with the positioning pins 3143 engaged into the fans 36. A plurality of screws extend through the fixing holes 3511 of the support members 35 and are fastened to the sidewalls 311 of the frame 31 to fix the support members 35 to the sidewalls 311 of the frame 31, respectively.

Figure 6:
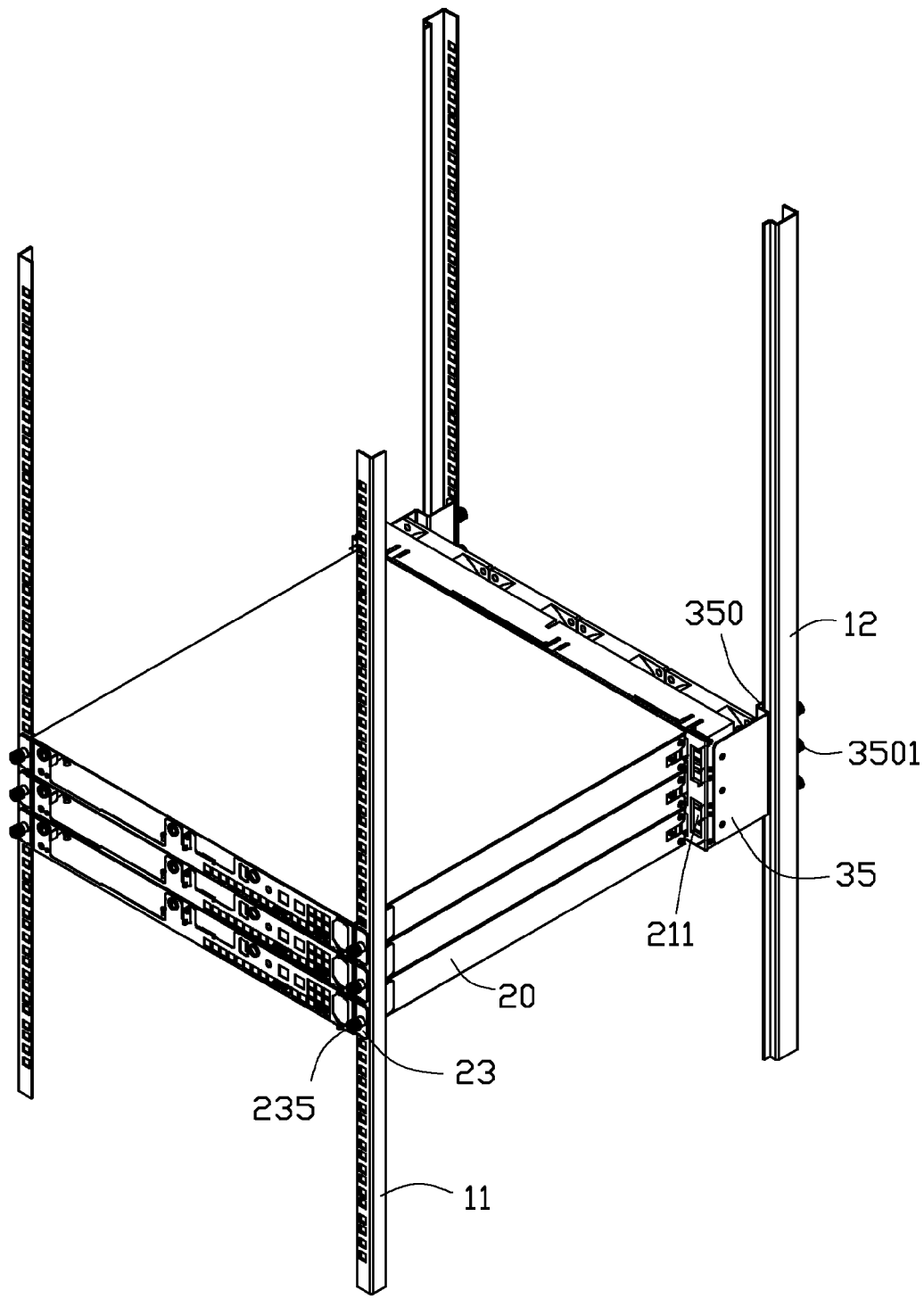
FIG. 6 is an assembled view of FIG. 1.

Referring to FIG. 6, to mount the fan assembly 30 to the rack 10, the holding portions 350 of the support members 35 are respectively fitted about the rear support posts 12 of the rack 10. The captive screws 3501 of the support members 35 are fastened in the corresponding positioning holes of the rear support posts 12 of the rack 10.

In the assembling of each server unit 20 to the rack 10, the server unit 20 is slid rearward into the rack 10 from a front of the rack 10, aligning with one of the air passages 318 of the air assembly 30. The tabs 211 of the chassis 21 of the server unit 20 extend through, and are supported on the vent plate 33 of the fan assembly 30. The server unit 20 further slides rearward to make the mounting brackets 23 of the server unit 20 correspondingly abut against front surfaces of the front posts 11 of the rack 10. The captive screws 235 of the mounting brackets 23 of the server unit 20 are correspondingly fastened to the positioning holes of the front posts 11 of the rack 10. At the same time, the tabs 211 of the chassis 21 of the server unit 20 abut against the abutting blocks 3214 of two door plates 321 in the air passage 318 to pivot the door plates 321 rearwards to uncover the air passage 318, thereby deforming the corresponding resilient members 34. Therefore, the air flow generated by the fans 36 can reach the server unit 20 to provide heat dissipation for the server unit 20.

To detach a server unit 20, the captive screws 235 of the server units 20 are loosened. The server unit 20 is ready to slide forward out of the rack 10. With the server unit 20 sliding forwards, the corresponding resilient members 34 are restored to pivot the corresponding door plates 321 forward to cover the air passage 318.

It is to be understood, however, that even though numerous characteristics and advantages of the present disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A rackable server system comprising:
a rack;
a fan assembly mounted to a rear of the rack, and comprising a frame secured to the rack and defining a plurality of air passages, a plurality of fans attached to the frame and aligned with the air passages, and a plurality of door plates attached to the frame and correspondingly arranged in the air passages, each of the door plates being pivotable between a first position to cover one of the air passages, and a second position to uncover the air passage; and
a plurality of server units slidably received in the rack, correspondingly aligned with the air passages of the frame, and rear ends of the server units resisting against the door plates to pivot the door plates to the second position.

2. The rackable server system of claim 1, wherein the frame is substantially rectangular, and comprises opposite sidewalls, a top wall, a bottom wall opposite to the top wall, and a plurality of partitioning plates perpendicularly connected between the sidewalls, and spaced from each other, wherein the sidewalls, top wall, bottom wall, and partitioning plates bound the air passages.

3. The rackable server system of claim 2, wherein the frame further comprises a back plate connected to rear sides of the sidewalls, the top wall, and the bottom wall, the plurality of fans is attached to the back plate.

4. The rackable server system of claim 3, wherein the fan assembly further comprises a vent plate fixed to front sides of the frame opposite to the back plate.

5. The rackable server system of claim 4, wherein the rack comprises two front support posts and two rear support posts, the frame is fixed to the rear support posts, front ends of the server units are fastened to the front support posts, a tab extends from the rear end of each of the server units, the tab is supported on the vent plate, and resists against the door plates.

6. The rackable server system of claim 4, wherein each of the sidewalls of the frame define a plurality of pivot slots, each of the door plates comprises opposite shafts pivotably engaged in the corresponding pivot slots.

7. The rackable server system of claim 6, wherein the fan assembly further comprises a plurality of resilient members correspondingly attached to the door plates to bias the door plates to the first position.

8. The rackable server system of claim 7, wherein the resilient members are torque springs correspondingly placed around the shafts of the door plates, each of the torque springs comprises a first torque arm abutting against one of the door plates, and a second torque arm abutting against the vent plate.

9. The rackable server system of claim 6, wherein the fan assembly further comprises a plurality of retaining members respectively engaged with the shafts of the door plates to sandwich the sidewalls of the frame together with the door plates.

10. A fan assembly to be mounted in a rack for accommodating a plurality of electronic module, the fan assembly comprising:
a frame secured to the rack and defining a plurality of air passages;
a plurality of fans attached to the frame and aligned with the corresponding air passages;
a plurality of door plates attached to the frame and correspondingly arranged in the air passages, each of the door plates pivotable between a first position to cover one of the air passages, and a second position to uncover the air passage; and
a plurality of resilient members correspondingly attached to the door plates to bias the door plates to the first position.

11. The fan assembly of claim 10, wherein the frame is substantially rectangular, and comprises opposite sidewalls, a top wall, a bottom wall opposite to the top wall, and a plurality of partitioning plates perpendicularly connected between the sidewalls, and spaced from each other, the air passages sidewalls is bounded by top wall, bottom wall, and partitioning plates.

12. The fan assembly of claim 11, wherein the frame further comprises a back plate connected to rear sides of the sidewalls, the top wall, and the bottom wall, the plurality of fans is attached to the back plate.

13. The fan assembly of claim 12, wherein the fan assembly further comprises a vent plate fixed to front sides of the frame opposite to the back plate.

14. The fan assembly of claim 13, wherein each of the sidewalls of the frame define a plurality of pivot slots, each of the door plates comprises opposite shafts pivotably engaged in the corresponding pivot slots.

15. The fan assembly of claim 14, wherein the resilient members are torque springs correspondingly placed around the shafts of the door plates, each of the torque springs comprises a first torque arm abutting against one of the door plates, and a second torque arm abutting against the vent plate.

16. The fan assembly of claim 14, wherein the fan assembly further comprises a plurality of retaining members respectively engaged with the shafts of the door plates to sandwich the sidewalls of the frame together with the door plates.

* * * * *